(12) United States Patent
Kneer et al.

(10) Patent No.: US 6,275,015 B1
(45) Date of Patent: Aug. 14, 2001

(54) CIRCUIT FOR REDUCING INPUT VOLTAGE

(75) Inventors: Andreas Kneer, Wendlingen; Peter Lutz, Weinsberg, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/508,450

(22) PCT Filed: Mar. 24, 1999

(86) PCT No.: PCT/DE99/00868

§ 371 Date: Mar. 8, 2000

§ 102(e) Date: Mar. 8, 2000

(87) PCT Pub. No.: WO00/05635

PCT Pub. Date: Feb. 3, 2000

(30) Foreign Application Priority Data

Jul. 23, 1998 (DE) .............................. 198 33 092

(51) Int. Cl.$^7$ .................................................. G05F 1/613
(52) U.S. Cl. ................................... 323/223; 363/62
(58) Field of Search ................................. 323/220, 223, 323/284; 363/62

(56) References Cited

U.S. PATENT DOCUMENTS

| | | |
|---|---|---|
| 3,636,382 | 1/1972 | Crouse . |
| 4,270,166 | * 5/1981 | Immler ................................. 363/89 |
| 5,521,488 | * 5/1996 | Stockstad et al. .................. 323/223 |

FOREIGN PATENT DOCUMENTS

| | | |
|---|---|---|
| 31 27 220 C2 | 4/1983 | (DE) . |
| 0 665 437 | 8/1995 | (EP) . |

* cited by examiner

*Primary Examiner*—Adolf Deneke Berhane
(74) *Attorney, Agent, or Firm*—Michael J. Striker

(57) ABSTRACT

A circuit arrangement for reducing a variable, in particular pulsed input voltage ($U_{ein}$) to an operating voltage $U_z$, $U_{arb}$ to be delivered to an evaluation circuit (10), in which the input voltage $U_{ein}$ can be reduced, in accordance with a division factor (F) made available by at least one voltage divider (R1, R3, T1, R4; R7, R8, R2), to obtain the operating voltage $U_z$, $U_{arb}$, in which the at least one voltage divider (R1, R3, T1, R4; R7, R8, R2), can be regulated in such a way that the division factor (F) can be increased with an increasing input voltage $U_{ein}$ and can be decreased with a decreasing input voltage $U_{ein}$.

10 Claims, 1 Drawing Sheet

CIRCUIT FOR REDUCING INPUT VOLTAGE

BACKGROUND OF THE INVENTION

1. Field of the Invention

The present invention relates to a circuit arrangement for reducing an input voltage, which in particular is pulsed, and to a corresponding method.

2. Description of the Prior Art

It is known to use inductive transducer arrangements for detecting rotary speeds, or rpm. By means of a gear wheel or pulse wheel rotating in front of an induction coil, a voltage proportional to the change in the magnetic field over time and thus to the rpm of the gear wheel is induced in the induction coil. These voltages can be delivered to a threshold stage that furnishes an rpm-dependent signal train.

One such circuit arrangement for generating an rpm-dependent signal train from the periodic voltage of an inductive transducer arrangement is known from German Patent DE 3127220C2for, instance.

For certain applications, it is usual to use gear wheels with a low number of teeth, for instance four teeth, as the pulse wheels. Then, however, the problem arises that during the relatively long intervals between two pulses, interference signals can impair the rpm detection, if their amplitudes exceed a threshold stage of an evaluation circuit. Such interference signals fluctuate to approximately the same extent as the input signal to be evaluated. To circumvent the attendant imprecision in rpm detection, it is known to perform a followup of the threshold value of the threshold value stage as a function of the rpm. The expense for circuitry required to create threshold value followup, however, must be viewed as considerable.

SUMMARY OF THE INVENTION

It is an object of the invention to create a circuit arrangement with which voltages of variable amplitude, which occur particularly in the operation of an inductive rpm transducer, can be reduced in such a way that incident interference signals can be distinguished, for instance by means of a threshold value stage, from measurement signals in a simple way.

According to the invention, with only a few, inexpensively obtainable components, a circuit arrangement can be created with which for instance in the operation of an inductive rpm transducer, measurement signal voltages can be separated or distinguished from incident interference signal voltages. To that end, rpm-dependent input voltages of an rpm transducer and interference voltages that occur for instance along the signal paths can be reduced in such a way that the signal voltages are reliably higher, and the interference voltages reliably lower, than a response threshold of an evaluation circuit. This is attained by providing that the division factor, generated by a variable voltage divider, is raised for relatively high input voltages and vice versa (that is, at relatively high input voltages, the operating voltage delivered to the evaluation circuit corresponds to a correspondingly lesser percentage of the input voltage.

Expediently, the operating voltage $U_z$, $U_{arb}$ can be regulated to a substantially constant value. As a result, it is possible to make the evaluation circuit, to which the operating voltage is supplied, especially simple.

In a preferred embodiment of the circuit arrangement of the invention, the voltage divider has at least one first resistor and one field effect transistor acting as a variable resistor.

With a field effect transistor of this kind, the desired voltage regulation can be done in a very simple and effective way.

Advantageously, a control input of the field effect transistor can be acted upon by a control voltage $U_s$ derived from the operating voltage $U_z$, $U_{arb}$. This makes use of the fact that the only resistance of field effect transistors is determined solely by a control voltage applied between their controller gate terminal and their source terminal. Such a control voltage is especially simple to control or regulate voltage.

Expediently, the circuit arrangement of the invention has a further voltage divider provided between the first voltage divider and the evaluation circuit. The provision of a second voltage divider enables optimal adaptation of the operating voltage to threshold voltage values of a downstream evaluation circuit.

In a further preferred embodiment of the circuit of the invention, the circuit is designed to divide downward or reduce an input voltage, present in differential form, to produce a differential operating voltage. This makes the signal lines ungrounded, and as a result interference factors can be reduced.

DETAILED DESCRIPTION OF THE PREFERRED EMBODIMENTS

The circuit arrangement has a first voltage divider R1, R3, T1, R4, by means of which a pulsed input voltage $U_{ein}$ present at an input E is divided downward to an intermediate voltage or first operating voltage $U_z$. In the view shown in FIG. 2, $U_z$ is located between points A and B. Via a second voltage divider R7, R8, R2, the voltage $U_z$ is divided downward to a second operating voltage $U_{arb}$ and delivered to an evaluation circuit 10. It should be noted that it would also be possible to supply the first operating voltage $U_z$ to the evaluation circuit.

While the second voltage divider divides the second operating voltage $U_{arb}$ applied to it downward by a constant division factor, the first voltage divider is embodied as a variable voltage divider. To that end, the first voltage divider has a field effect transistor or FET T1, whose control input G is acted upon by a control voltage $U_s$ derived from the operating voltage $U_{arb}$ (in the view of FIG. 2, $U_s$ is located between points B and C). The control voltage $U_s$ is generated by way of the charging of the capacitor C1, which is connected to the operating voltage $U_z$ with the interposition of a resistor R5 and a diode D1. The diode D1, at which a constant voltage drops, assures that the capacitor will not discharge via the resistor R5 in the intervals between voltage pulses. The capacitor is charged in a pulsed fashion and is discharged continuously via a resistor R6. The greater is the voltage $U_s$ applied to the control input of the FET T1, the farther the FET T1 is triggered, and as a result the ohmic resistance of the FET T1 decreases.

If no input voltage $U_{ein}$ or only a slight input voltage is applied, then only the voltages $U_z$ and $U_s$ are also relatively low. In this state, the FET T1 acts like a high-impedance resistor, since no significant voltage is applied to its control input G. The low input voltage is therefore reduced only slightly. A division factor F characterizing the voltage divider is relatively small in this state.

If the input voltage $U_{ein}$ is rising, the capacitor C1 is increasingly charged, so that the control input G of the FET T1 is acted upon by a control voltage $U_s$, as a result of which the FET T1 is triggered, so that its ohmic resistance drops. The input voltage is divided more markedly downward as a result; that is, the operating voltage $U_z$ corresponds to a smaller fraction of the input voltage $U_{ein}$. In this state, the division factor F characterizing the voltage divider is relatively high. Because as a result of the drop in the operating voltage $U_z$ the voltage of the capacitor C1 also drops again, a closed control loop is created by means of which the operating voltage U2 which is kept virtually constant even if the input voltage $U_{ein}$ is varying.

Figure 1:
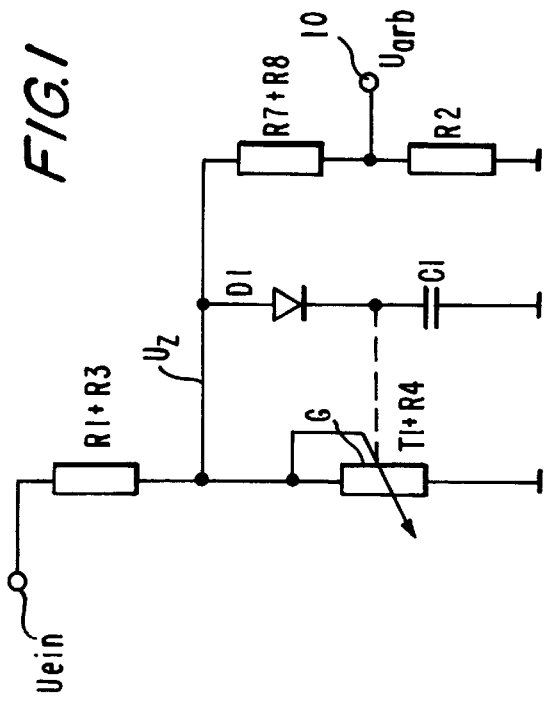
FIG. 1, a schematic block circuit diagram of a preferred embodiment of the circuit arrangement of the invention.
Figure 2:
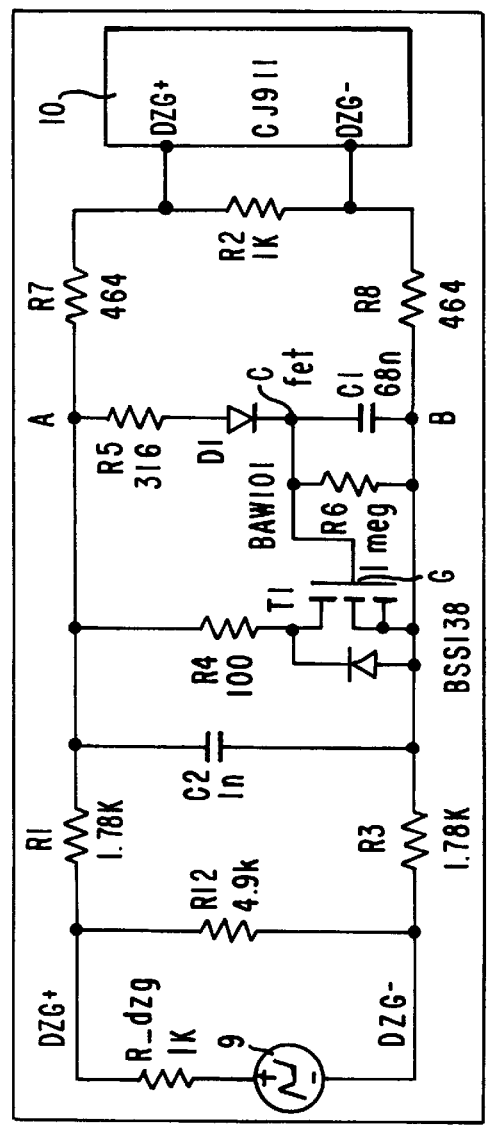
FIG. 2, a circuit diagram for realizing the circuit arrangement of FIG. 1, in which the incident voltage signals are in the form of differential signals.

The circuit arrangement shown in FIG. 2 is designed to process differential voltage signals. Because ungrounded or floating ground signal paths are present, the incidence of ground-caused interference signals can be avoided. An rpm transducer 9 schematically shown in FIG. 2 generates the input voltage $U_{ein}$, which is supplied to the first and second voltage divider via respective lines DZG+ and DZG−. The resistor Rdzg corresponds here to the internal resistance of the rpm transducer 9. The resistor R12 represents the input resistance of the circuit arrangement with respect to the rpm transducer 9.

In the dimensioning of the components of the circuit arrangement according to the invention, the switching threshold of the evaluation circuit 10 should be taken into account in particular. The resistance and capacitance values given as examples in FIG. 2 are designed for adaptation of the input voltage, generated by an inductive rpm transducer, to an evaluation circuit 10 with a switching threshold of 40 and 400 mV, respectively. For instance, the operating voltage $V_z$ is dependent on the threshold voltage of the FET T1 and on the on-state voltage of the diode D1 and is therefore severely affected by tolerances. The second voltage divider R7, R8, R2 should therefore be dimensioned such that even for the worst-case scenario, the switching threshold of the evaluation circuit 10 will be exceeded by the operating voltage $U_{arb}$ made available by the second voltage divider.

By doubling the resistance of R1 and by bridging R3, for instance, the circuit arrangement of the invention can also be used with an asymmetrical rpm transducer. In that case, the DZG line should be connected to ground.

Since the FET T1 has a diode D2 connected in the inverse direction relative to the input voltage, the negative half wave of the input signal is always maximally limited, so that advantageously an evaluation circuit which switches at the zero crossover of the signal will be used.

Since a fast reaction to rising amplitudes or levels of the input signal is demanded of the circuit arrangement, but the incident frequencies of the input signal are relatively low, for instance if a pulse wheel that generates four pulses per revolution is used in the rpm transducer, the capacitor C1 must be capable of rapid charging but slow discharging. For this reason, a high-impedance discharge resistor R6 and a low-impedance charging resistor R1+R5 are provided. Resistor R6 must not be selected to be too high in this case, since then the risk of interference increases. The resistor R3, which absorbs a majority of the excess pulse energy must not be too small in size, since then the risk of an overload exists.

Electromagnetic interference factors could cause charging of the capacitor C1, resulting in a disproportionately great reduction or damping of the operating voltage. Such interference factors can be effectively avoided by the provision of a second capacitor C2, which is connected between the lines DZG+ and DZG−.

What is claimed is:

1. A circuit arrangement for reducing a variable pulsed input voltage (Uein) to an operating voltage (U or b) to be delivered to an evaluation circuit in which the input voltage (U ein) can be reduced, the circuit arrangement comprising at least one voltage divider (R1, R3, T1, R4; R7, R8, R2) including a transistor (T1), the at least one voltage divider providing a division factor according to which the input voltage (U ein) can be reduced so as to obtain the operating voltage (Uarb), the at least one voltage divider being regulated in such a way that the division factor (F) can be increased with an increasing input voltage (U ein) and can be decreased with a decreasing input voltage (U ein), wherein the transistor is a field effect transistor having a control input (G) which can be acted upon by a control voltage derived from one of the operating voltage (Uarb) supplied to the evaluation circuit and an intermediate operating voltage (Us).

2. The circuit arrangement of claim 1, wherein each of the intermediate operating voltage ($U_s$), and the operating voltage (Uarb) can be regulated to a substantially constant value.

3. The circuit arrangement of claim 1, wherein the at least one voltage divider further includes at least two resistors (R1, R3), and the field effect transistor (T1) acts as a variable resistor.

4. The circuit arrangement of claim 1, further comprising a further voltage divider (R7, R8, R2) provided between the first voltage divider and the evaluation circuit (10).

5. The circuit arrangement of claim 2, wherein the input voltage Uein present in differential form can be converted into a differential operating voltage which can be one of the intermediate operating voltage ($U_s$) and the operating voltage (Uarb) supplied to the evaluation circuit.

6. A method for reducing a variable, in particular pulsed input voltage (Uein) to an operating voltage (Uarb) to be supplied to an evaluation circuit or an intermediate operating voltage ($U_s$) the method comprising the steps of:

providing a voltage divider;

in position of the input voltage (Uein) on the voltage divider (R1, R3, T1, R4) reducing by the voltage divider (R1, R3, T1, R4), the input voltage Uein in accordance with a division factor (F) for attaining the intermediate operating voltage ($U_s$) or the operating voltage (Uarb); and regulating the voltage divider (R1, R3, T1, R4) in such a way that with an increasing in put voltage Uein, the division factor (F) of the voltage divider (R1, R3, T1, R4) is increased, and with a decreasing input voltage the division factor is decreased.

7. The method of claim 6, wherein the intermediate operating voltage ($U_s$) and the operating voltage (Uarb) is each regulated to a substantially constant value.

8. The method of claim 6, wherein a control input G of a field effect transistor (T1), which forms a variable resistor of the voltage divider (R1, R3, T1, R4) is acted upon by a voltage signal associated with the intermediate operating voltage ($U_s$) or the operating voltage ($U_{arb}$) supplied to the evaluation circuit.

9. The method of claim 6, wherein the intermediate operating voltage ($U_s$), is delivered to a further voltage divider (R7, R8, R2) disposed between the voltage divider (R1, R3, T1, R4) and the evaluation circuit (10).

10. The method of claim 6, wherein an input signal Uein present in differential form is converted into a differential operating voltage which can be one of the intermediate operating voltage ($U_s$) and the operating voltage (Uarb) supplied to the evaluation circuit.

* * * * *